United States Patent [19]
Hayase et al.

[11] Patent Number: 5,998,509
[45] Date of Patent: Dec. 7, 1999

[54] RESIN COMPOSITION AND SEMICONDUCTOR DEVICE EMPLOYING THE SAME

[75] Inventors: Rumiko Hayase, Yokohama; Shinetsu Fujieda, Kawasaki; Yasuyuki Hotta, Funabashi; Shinji Murai, Ichikawa, all of Japan

[73] Assignee: Kabushiki Kaisha Toshiba, Kawasaki, Japan

[21] Appl. No.: 08/980,343

[22] Filed: Nov. 28, 1997

[30] Foreign Application Priority Data

Nov. 29, 1996 [JP] Japan .................................. 8-319419
Nov. 28, 1997 [JP] Japan .................................. 9-329303

[51] Int. Cl.$^6$ .......................... C08K 3/34; C08L 63/02
[52] U.S. Cl. ............................. 523/425; 525/474
[58] Field of Search ......................... 523/423, 425; 525/474

[56] References Cited

U.S. PATENT DOCUMENTS 4,720,515   1/1988   Iji et al. ................................. 523/423
5,198,520   3/1993   Onishi et al. .
5,206,312   4/1993   Lia et al. ................................ 525/474
5,336,736   8/1994   Nakano et al. ........................ 525/474

FOREIGN PATENT DOCUMENTS 62-229136   10/1987   Japan .
2-140227    5/1990    Japan .
5-287172    11/1993   Japan .

*Primary Examiner*—Robert Dawson
*Assistant Examiner*—D. Aylward
*Attorney, Agent, or Firm*—Oblon, Spivak, McClelland, Maier & Neustadt, P.C.

[57] ABSTRACT

A resin composition comprising (a) an epoxy compound, (b) a curing agent comprising a polysiloxane resin having a phenolic hydroxyl group on its side chain, and (c) an inorganic filler. The mixing ratio of the inorganic filler should preferably be 10 to 95% by weight based on the entire resin composition.

25 Claims, 1 Drawing Sheet

RESIN COMPOSITION AND SEMICONDUCTOR DEVICE EMPLOYING THE SAME

BACKGROUND OF THE INVENTION

This invention relates to a resin composition which is excellent in moldability and heat resistance and hence suited for use in encapsulating a semiconductor device, and to a resin-encapsulated semiconductor device which is sealed with the resin composition.

With the current trend to further increasing the integration of semiconductor elements, the miniaturization of various function units of the elements and the enlargement of the elements per se are rapidly progressing now. For the purpose of sealing such semiconductor element with a resin composition, an epoxy resin composition comprising a thermosetting epoxy resin as a main component and a phenol resin as a curing agent has been extensively employed.

For example, a gate array of so-called ASIC (Application Specific IC) or a surface mount type package represented by a standard cell type LSI has been produced by making use of the aforementioned epoxy resin composition as a sealing resin. In the process of mounting these semiconductor devices on a substrate, various processes such as a vapor phase reflow, an infra-violet ray reflow and a solder dipping have been adopted. In this mounting process, the package is exposed to a high temperature in the order of 215 to 260° C., so that a trace of water which has been penetrated into the package is suddenly vaporized, thus often giving rise to the generation of a crack in the sealing resin.

When the crack is extended to the external surface of the sealing resin, the moisture resistance reliability of resin-encapsulated semiconductor device will be damaged raising a serious problem. Moreover, when a crack is generated in the sealing resin, the resin will be caused to swell resulting in the deformation of the package, thus possibly making it difficult to mount the package on a substrate.

Furthermore, when such a package is mounted on a substrate, various problems including a cracking may be brought about even in the interior of the semiconductor element sealed with a resin. For example, PSG (phosphosilicate glass) or SiN (silicon nitride) which is used as a passivation film for a metallic interconnecting wiring layer formed of aluminum for example may be cracked, or the breakage of a gold bonding wire may be caused.

To solve these problems, there have been various demands as described below in the manufacture of a resin-encapsulated semiconductor device in particular of large size, these demands being mainly related to the sealing resin.

(1) The stress to be laid upon inner devices by the sealing resin should be minimized, and the adhesion between the sealing resin and a lead frame or a film such as PSG film, SiN film or polyimide film which is formed on a semiconductor element should be improved.

(2) The sealing resin should be excellent in heat resistance, i.e., sufficiently high in high temperature strength or in high temperature strength under moisture absorption so as to enable it to withstand the mounting temperature of the package. At the same time, the hygroscopicity of the sealing resin should be as low as possible.

On the other hand, in order to minimize the mounting area of a semiconductor chip in view of the popularization of a notebook type personal computer and a potable telephone, a flip chip mounting which enables a bare chip to be directly adhered onto a substrate has been widely adopted. In order to perform this flip chip mounting, a liquid sealing resin which is excellent in reliability, i.e. low in hygroscopicity and excellent in adhesivity is required to be employed.

In view of these demands, there has been developed a method of using a resin composition containing a silicone oil, the addition of which is intended to minimize the stress to be laid upon inner devices by the sealing resin and to improve the adhesion between the sealing resin and a lead frame, etc. However, the addition of silicone oil is accompanied with the problems that the silicone may oozed out to the surface of the molded product, thereby making the product defective in outer appearance or soiling a metal mold.

The conventional epoxy resin composition generally contains an acid anhydride or an amine compound as a curing agent. However, the resin composition containing such a curing agent is high in hygroscopicity, thus making it difficult to obtain a sealing resin having a highly reliable moisture resistance.

As explained above, a resin composition which is not only provided with every kinds of features demanded when it is to be used as a sealing resin, but also capable of exhibiting a low water absorption and avoiding the soiling of a metal mold is not yet available up to date.

BRIEF SUMMARY OF THE INVENTION

Accordingly, an object of the present invention is to provide a resin composition for encapsulating a semiconductor device which is excellent in moldability and heat resistance, and at the same time low in water absorption.

Another object of the present invention is to provide a resin-encapsulated semiconductor device which is excellent in heat resistance and thermal shock resistance, and at the same time high in moisture resistance reliability.

Namely, according to the present invention, there is provided a resin composition comprising: (a) an epoxy compound; (b) a curing agent comprising a polysiloxane resin having a phenolic hydroxyl group on its side chain; and (c) an inorganic filler.

Furthermore, according to the present invention, there is provided a resin composition comprising: (a) an epoxy compound; (b) a curing agent comprising a polysiloxane resin having a repeating unit represented by the following general formula (PS1) and/or a repeating unit represented by the following general formula (PS2); and (c) an inorganic filler.

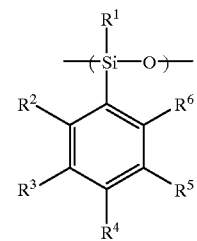

(PS1)

wherein $R^1$ is selected from the group consisting of alkyl group, vinyl group, allyl group, a substituted or unsubstituted aryl group each having 1 to 10 carbon atoms and a substituted or unsubstituted siloxy group; $R^2$ to $R^6$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, allyloxy group, allyl group and a substituted or unsubstituted aryl group, with a proviso that at least one of $R^2$ to $R^6$ is hydroxyl group.

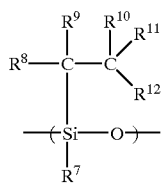

(PS2)

wherein $R^7$ is selected from the group consisting of a substituted or unsubstituted alkyl group having 1 to 10 carbon atoms, a substituted or unsubstituted aryl group having 6 to 14 carbon atoms and a substituted or unsubstituted siloxy group; $R^8$ to $R^{12}$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, acyloxy group, allyloxy group, allyl group, a substituted or unsubstituted aryl group having 6 to 14 carbon atoms, amide group and imide group, with a proviso that at least one of $R^8$ to $R^{12}$ is phenolic hydroxyl group or group having phenolic hydroxyl group.

According to this invention, there is further provided a resin-encapsulated semiconductor device comprising a substrate, a semiconductor element disposed on the surface of the substrate and a resin layer for sealing the semiconductor element, wherein said resin layer is formed of a cured material of any one of aforementioned resin compositions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
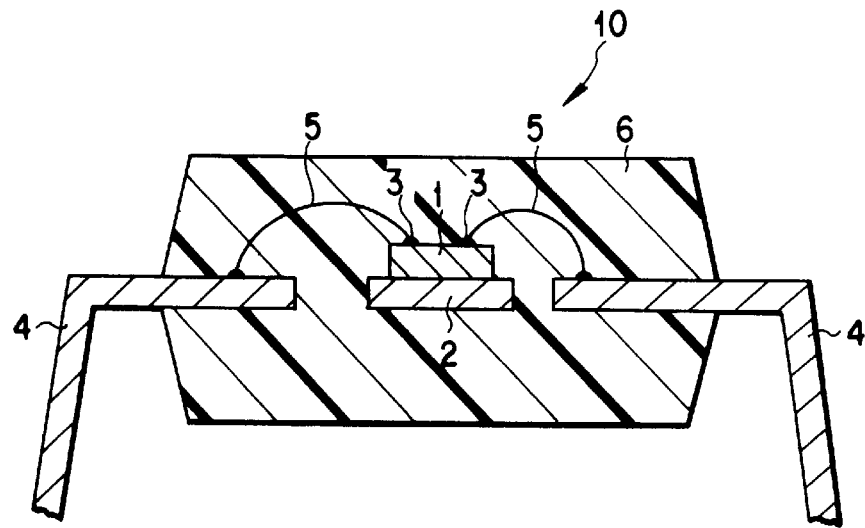
FIG. 1 is a sectional view showing one example of the resin-encapsulated semiconductor device of this invention.

This invention will be further explained in detail with reference to the following preferred embodiments.

As for the epoxy compound constituting the (a) component in the resin composition of this invention, any kinds of epoxy compounds can be employed as long as it contains in its molecule two or more epoxy groups. Examples of such compound are diglycidyl ether of bisphenol A, diglycidyl ether of bisphenol F, diglycidyl ether of biphenylether and derivatives thereof, diglicidyl ether of biphenyl and derivatives thereof, phenol novolak type epoxy resin, cresol novolak type epoxy resin, naphthol novolak epoxy resin, bisphenol A novolak epoxy resin, an epoxy resin derived from the epoxidation of a condensate of phenol or alkylphenol with hydroxybenzaldehyde, epoxidized tris (hydroxyphenyl) alkane, epoxidized tetra(hydroxyphenyl) alkane, tetraglycidyl ether of 2,2',4,4'-tetrahydroxybenzophenone, N,N-diglycidylamino-4-glycidoxybenzene, 1,3,5-triglycidoxy-benzene, 2,2', 4,4'-tetraglycidoxy biphenyl, 4,4'-bis(2,3-epoxypropoxy)-3,3',5,5'-tetramethyl biphenyl, N,N,N',N'-tetraglycidylaminodiphenyl methane, and condensates thereof, alicyclic epoxy resin, and halogenized epoxy resins.

The aforementioned epoxy compounds can be suitably selected depending on the (b) component employed as a curing agent in the resin composition of this invention. Further, the total amount of the epoxy resin and the curing agent constituting the (b) component in the resin composition of this invention can be suitably determined by taking the adjustment of melt viscosity and the thermal expansion coefficient of molded product into consideration. For example, when the resin composition is to be employed for encapsulating a semiconductor element, the total amount of the epoxy resin and the curing agent should preferably be confined to the range of from 5 parts by weight to 50 parts by weight based on the resin compound.

The (b) component in the resin composition of this invention is a curing agent for curing the aforementioned epoxy compound constituting the (a) component and contains a polysiloxane resin having on its side chain a phenolic hydroxyl group. As for this polysiloxane resin having on its side chain a phenolic hydroxyl group, the employment of a polysiloxane resin having a repeating unit represented by the following general formula (PS1) or a repeating unit represented by the following general formula (PS2) is preferable.

(PS1)

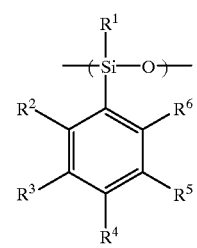

wherein $R^1$ is selected from the group consisting of alkyl group, vinyl group, allyl group, a substituted or unsubstituted aryl group each having 1 to 10 carbon atoms and a substituted or unsubstituted siloxy group; $R^2$ to $R^6$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, allyloxy group, allyl group and a substituted or unsubstituted aryl group, with a proviso that at least one of $R^2$ to $R^6$ is hydroxyl group.

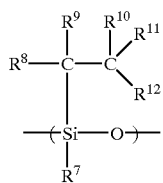
(PS2)

wherein $R^7$ is selected from the group consisting of a substituted or unsubstituted alkyl group having 1 to 10 carbon atoms, a substituted or unsubstituted aryl group having 6 to 14 carbon atoms and a substituted or unsubstituted siloxy group; $R^8$ to $R^{12}$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, acyloxy group, allyloxy group, allyl group, a substituted or unsubstituted aryl group having 6 to 14 carbon atoms, amide group and imide group, with a proviso that at least one of $R^8$ to $R^{12}$ is phenolic hydroxyl group or group having phenolic hydroxyl group.

Examples of the alkyl group having 1 to 10 carbon atoms in the aforementioned general formula (PS1) include methyl, ethyl, n-propyl, iso-propyl, n-butyl, sec-butyl, t-butyl, n-pentyl, n-hexyl, n-octyl, n-nonyl and n-decanyl group. Examples of the substituted or unsubstituted aryl group in the general formula (PS1) include phenyl, o-hydroxyphenyl, p-hydroxyphenyl, o-methylphenyl, p-methylphenyl, β-naphthyl, and p-chlorophenyl.

On the other hand, as for the alkyl group having 1 to 10 carbon atoms in the aforementioned general formula (PS2), the same kinds of groups as mentioned above may be employed. As for the substituted aryl group, o-methoxyphenyl, p-methoxyphenyl and 9-anthranyl group may be employed in addition to the groups exemplified above. It is also permissible in this general formula (PS2) that any one of groups represented by $R^8$ and $R^9$ is connected together with any one of groups represented by $R^{10}$, $R^{11}$ and $R^{12}$ to form a closed ring.

When the $R^1$ in the aforementioned general formula (PS1) and the $R^7$ in the aforementioned general formula (PS2) are constituted by a substituted or unsubstituted siloxy group, these groups may be linked to a substituted or unsubstituted siloxy group of the neighboring repeating unit, whereby forming, via a (—Si—O—Si—) bond shown below, a two-dimensional or three-dimensional structure. Additionally, it is also permissible that these siloxy groups constituting the $R^1$ and $R^7$ may be linked to a substituted or unsubstituted siloxy group of other molecules rather than the siloxy group of the neighboring repeating unit, whereby forming a two-dimensional or three-dimensional structure likewise.

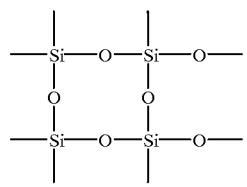

As for the repeating units represented by the following general formula (PS1) and/or general formula (PS2), the following repeating units represented by the following chemical formulas (1) to (34) may be exemplified.

(1)
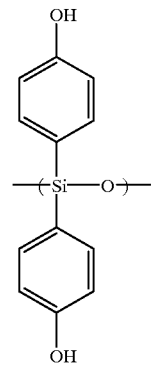

(2)
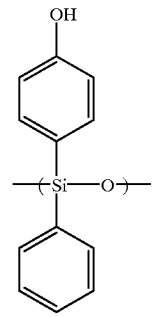

(3)
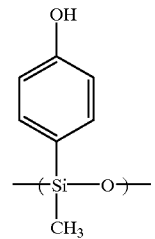

(4)
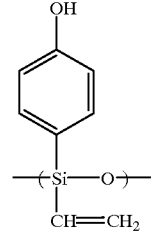

(5)
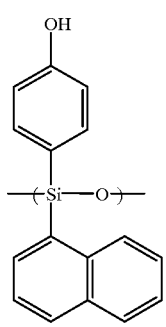
(6)
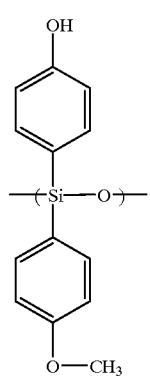
(7)
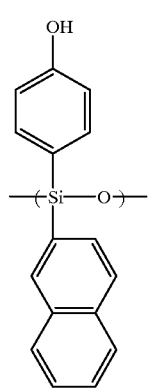
(8)
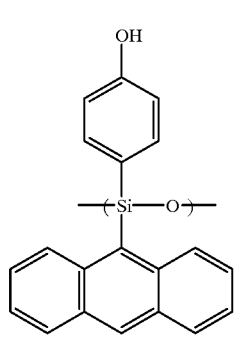
(9)
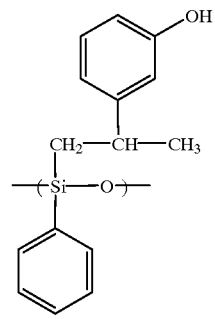
(10)
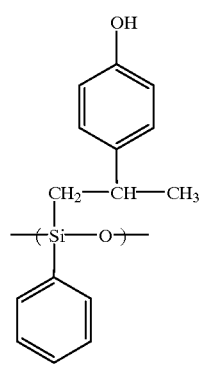
(11)
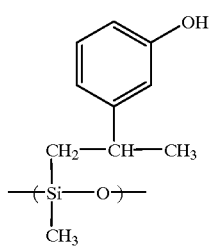
(12)
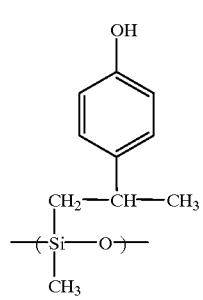

(13)
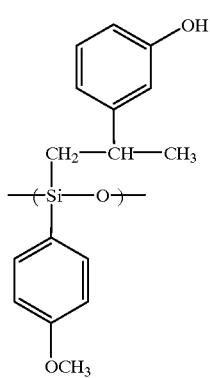
(14)
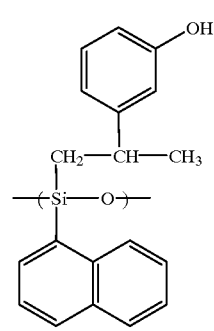
(15)
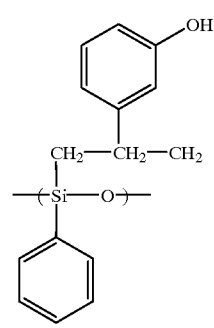
(16)
(17)
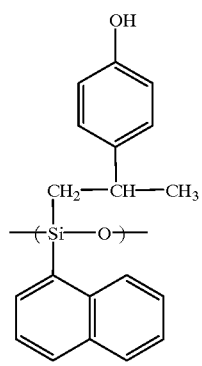
(18)
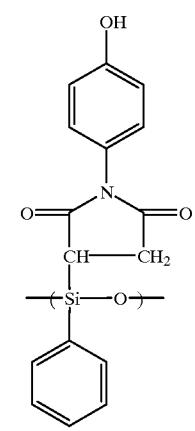
(14)
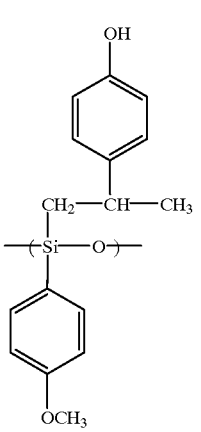
(19)
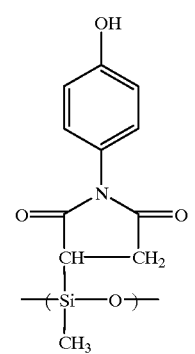

(20) 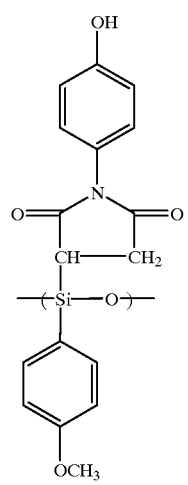
(21) 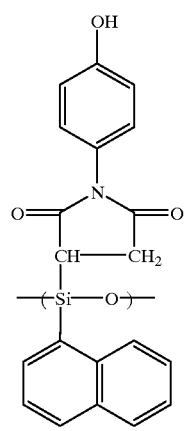
(22) 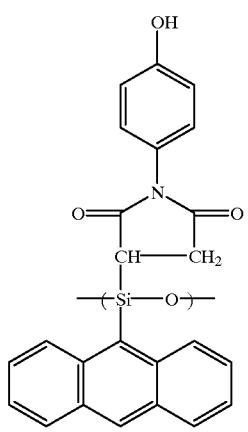
(23) 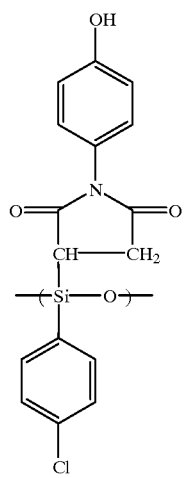
(24) 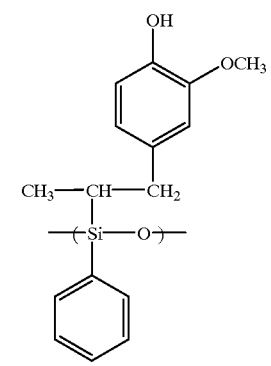
(25) 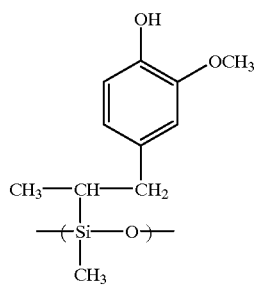
(26) 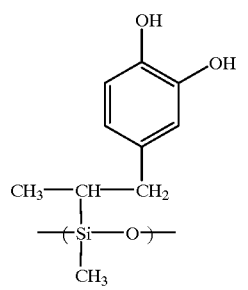

(27) 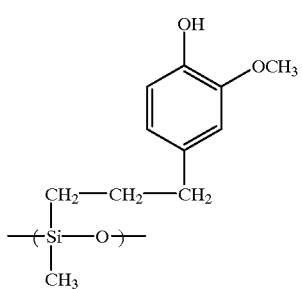
(28) 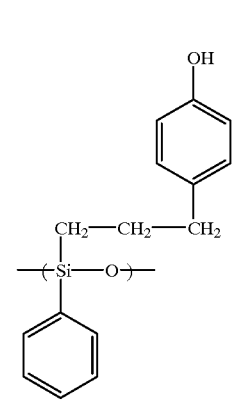
(29) 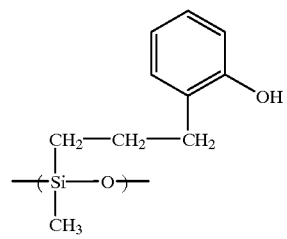
(30) 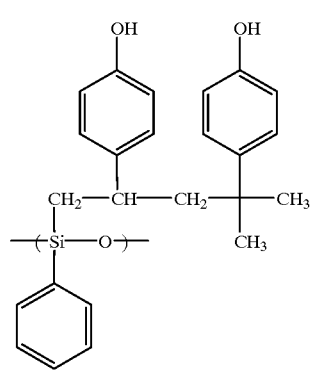
(31) 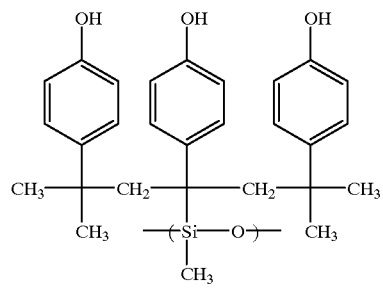
(32) 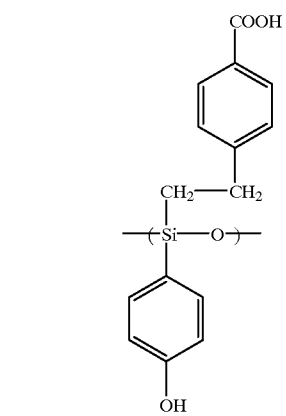
(33) 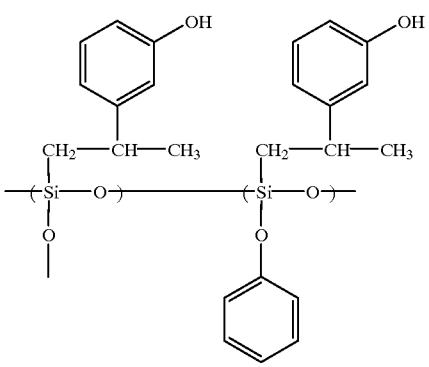
(34) 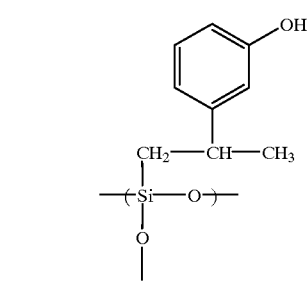

The compounds having a repeating unit represented by the general formula (PS1) can be manufactured by the method for example discribed below. Specifically, trichlorophenylsilane is mixed with ethanol in the molar ratio of 1:2, and reacting the resultant mixture to obtain diethoxyphenylsilane. On the other hand, hydroxychlorobenzene is reacted with trimethylchlorosilane to obtain trimethylsilyloxychlorobenzene. Resultant trimethylsilyloxychlorobenzen is allowed to react with dimethoxyphenylsilane in the presense of metallic sodium to obtain trimethylsilyloxyphenyl diethoxyphenylsilane, which is the subjected to condensed through hydrolysis.

On the other hand, the compound having a repeating unit represented by the general formula (PS2) can be manufactured by the method disclosed for example in Japanese Patent Unexamined Publication H/62-229136. Specifically, the method comprises the steps of reacting a compound having an unsaturated bond, which is formed by protecting phenol with trimethylsilyl or alkylether with mono-substituted dichlorosilane or mono-substituted diethoxysilane by making use of a platinum catalyst, and then subjecting the resultant reaction product to a condensation reaction through hydrolysis.

The melting point and melt viscosity of the compound having a repeating unit represented by the compound having a repeating unit represented by the general formula (PS1) as well as the compound having a repeating unit represented by the general formula (PS2) can be controlled by making them into a copolymer by a process wherein dichlorosilane such as dimethyldichlorosilane, methylphenyldichlorosilane and diphenyldichlorosilane is mixed with dichlorosilane having phenol, hydroxyl group thereof is protected, and then the resultant mixture is allowed to condense through hydrolysis.

For example, it is possible to obtain a polysiloxane resin having a high glass transition point by copolymerizing dichlorosilane having phenyl group such as phenylmethyldichlorosilane and diphenyldichlorosilane with dichlorosilane having protected phenolic hydroxyl group. It is also possible to obtain a polysiloxane resin having a high glass transition point by introducing phenyl group or naphthyl group into the $R^1$ of the general formula (PS1) or into the $R^7$ of the general formula (PS2).

On the other hand, it is possible to obtain a polysiloxane resin having a low melt viscosity by copolymerizing the repeating unit represented by the general formula (PS1) and/or the repeating unit represented by the general formula (PS2) with dimethylsiloxane. It is also possible to obtain a polysiloxane resin having a low melt viscosity by introducing methyl group or ethyl group into the $R^1$ of the general formula (PS1) or into the $R^7$ of the general formula (PS2). It may be possible to obtain a polysiloxane resin having a low melt viscosity without performing the aforementioned copolymerization with the dimethylsiloxane, since there is a tendency that the polysiloxane to be generally obtained is relatively low in molecular weight.

The melting point and melt viscosity of polysiloxane resin to be employed in this invention can be suitably determined depending on the resin composition intended to obtain and the molding method of the resin composition. For example, if the resin composition intended is liquid, the melt viscosity of the polysiloxane resin should preferably be about 0.01 to 10 Pa·S as measured at a molding temperature. On the other hand, if the resin composition intended is solid, the melt viscosity of the polysiloxane resin should preferably be about 5 to 500 Pa·S as measured at a molding temperature.

The molecular weight of the aforementioned polysiloxane resin should preferably be 300 to 50,000, more preferably 500 to 30,000. Because, if the molecular weight thereof is less than 300, the heat resistance and thermal shock resistance of the polysiloxane resin would be deteriorated. On the other hand, if the molecular weight thereof exceeds over 50,000, the moldability of the polysiloxane resin would be deteriorated.

It is also possible according to this invention to mix a compound which is generally known as a curing agent for an epoxy compound into the (b) component in addition to the polysiloxane having the aforementioned phenolic hydroxyl group on its side chain. Examples of such a compound include amines, acid anhydrides and phenols.

Specific examples of the aforementioned amines are diethylene triamine, triethylene tetraamine, diethylamino propylamine, N-aminoethyl piperazine, benzyl dimethylamine, tris(dimethylaminomethyl) phenol, methaphenylene diamine, diaminodiphenylmethane, diaminodiphenyl sulfone, polyamide resin (amine value: 200 to 350), dicyandiamide, boron trifluoride monoethylamine, methane diamine, xylene diamine, bisaminopropyl tetraoxaspiroundecane adduct and ethylmethylimidazole. Specific examples of the aforementioned acid anhydride are phthalic anhydride, maleic anhydride, dodecyl succinic anhydride, hexahydrophthalic anhydride, tetrahydrophthalic anhydride, methyl hexahydrophthalic anhydride, methyl tetrahydrophthalic anhydride, methyl nadic anhydride, pyromellitic anhydride, benzophenone tetracarboxylic anhydride, dichloro succinic anhydride and chlorendic anhydride.

Specific examples of the aforementioned phenols include novolak phenol resin. In this case, any kinds of novolak type phenol resin can be employed as long as it contains two or more phenolic hydroxyl groups in its one molecule. For example, phenol novolak resin, cresol novolak resin, t-butylphenol novolak resin, nonylphenol novolak resin, phenol aralkyl resin and dicyclopentadienephenol novolak resin can be employed. Among these phenol resins, phenol novolak resin is preferable in view of moldability and mechanical strength thereof.

Specific examples of phenol novolak resin are Shounol BRG-555 (Showa High Polymer Co., Ltd. softening point: 68° C., melt viscosity: 2.4 Pa·S at 125° C.), Shounol BRG-556 (Showa High Polymer Co., Ltd. softening point: 80° C., melt viscosity: 1.8 Pa·S at 150° C.), Shounol BRG-558 (Showa High Polymer Co., Ltd. softening point: 97° C., melt viscosity: 6.2 Pa·S at 150° C.), Barcam TD-2131 (Dainippon Ink & Chemicals Inc. softening point: 80° C., melt viscosity: 30 Pa·S at 150° C.), Barcam TD-2093 (Dainippon Ink & Chemicals Inc. softening point: 100° C., melt viscosity: 30 Pa·S at 150° C.). It is also possible to use phenol resin having allyl group such as SH-140A (Mitsubishi Petrochemical Co., Ltd.), SH-150A (Mitsubishi Petrochemical Co., Ltd.), and XPSF-4488 (Gunei Chemical Industry Co., Ltd.).

The mixing ratio of the curing agent constituting the (b) component and comprising a polysiloxane resin having phenolic hydroxyl group on its side chain and optionally the aforementioned compound which is generally known as a curing agent for epoxy resin should preferably be determined so as to meet the following conditions. Namely, the total of the epoxy resin constituting the (a) component and the (b) component should be 5 to 90% by weight based on the total weight of the resin composition, and at the same time the ratio between the epoxy group (EP) of the (a) component and the phenolic hydroxyl group (phOH) in the (b) component (EP/phOH) should be in the range of 1/1.2 to 1/0.2.

If the total amount of the (a) component and (b) component is less than 5% by weight, the fluidity of the resin composition would be deteriorated thereby giving rise to the drifting of bonding wire or the dislocation of bed at the occasion of molding. On the other hand, if aforementioned total amount exceeds over 90% by weight, the thermal expansion coefficient of the cured product becomes high so that a sufficient heat resistance may not be obtained. Furthermore, if the ratio between the epoxy group of the (a) component and the phenolic hydroxyl group in the (b) component falls out of the aforementioned range, the heat resistance of the cured product would be deteriorated or the curing rate of the resin composition becomes too low, thus making it difficult to mold the resin composition.

Additionally, the mixing ratio of the (b) component constituting the curing agent should preferably be confined to 5 to 100 parts by weight per 100 parts be weight of the (a) component while meeting the aforementioned conditions. If the mixing ratio of the (b) component is less than 5 parts by weight, it would be difficult to attain a sufficient heat resistance, or the melt viscosity of the resin composition becomes too high, thus deteriorating the moldability of the resin composition. On the other hand, if the mixing ratio of the (b) component exceeds over 100 parts by weight, the water absorption of the cured material becomes too high, thus deteriorating the reliability of the molded product.

As for inorganic filler constituting (c) component of the resin composition according to this invention, quartz glass, crystalline silica, fused silica, zircon, alumina, calcium silicate, barium sulfate, magnesite, clay, kaolin, talc, mica, glass fibers, ceramic fibers, carbon silicate, nitrogen silicate, aluminum nitride, titanium white, calcium carbonate and gypsum can be employed. Among them, quartz glass, crystalline silica and fused silica are more preferable, since these inorganic fillers enable a resin composition exhibiting a low moisture absorption and a low melt viscosity to be obtained. As for the crystalline silica and fused silica, although there are two types in the shape thereof, i.e., a crushed silica and a spherical silica, they may be used by suitably mixing them.

The mixing ratio of the inorganic filler should preferably be 10 to 95% by weight, more preferably be in 40 to 90% by weight based on the entire resin composition. If the mixing ratio is less than 10% by weight, the thermal expansion coefficient of the cured material may become so large that a sufficient thermal shock resistance can not be obtained. On the other hand, if the content exceeds over 95% by weight, the flowability of the resin composition would be so deteriorated that the drifting of bonding wire or the dislocation of the bed during the molding step thereof may be caused to occur.

If the resin composition of this invention is to be employed for sealing a flip chip where an IC or an LSI is directly mounted on a substrate, it is highly desired that the space between the substrate and a semiconductor element can be easily filled with the resin composition. Therefore, the maximum particle diameter as well as the average particle diameter of the inorganic filler constituting the (c) component should preferably be confined to a predetermined range. For instance, the maximum particle diameter of the inorganic filler should preferably be 50 $\mu$m or less, more preferably 30 $\mu$m or less. Since the height of the space between a semiconductor and a substrate is generally in the order of 50 $\mu$m to 150 $\mu$m, a resin composition containing an inorganic filler whose maximum particle diameter exceeds over 50 $\mu$m may not be introduced into the gap, may cause a non-uniform filling of the resin composition thereby inviting a defective insulation, or may generate a package crack under some circumstances. On the other hand, the average particle diameter of the inorganic filler should preferably be in the range of from 0.5 $\mu$m to 50 $\mu$m. If the average particle diameter of the inorganic filler is less than 0.5 $\mu$m, the viscosity of the resin composition would be excessively increased, whereby decreasing the velocity filling the resin composition and hence deteriorating the working efficiency. On the other hand, if the average particle diameter of the inorganic filler exceeds over 50 $\mu$m, the filling property of the resin composition into the space between a semiconductor and a substrate may be deteriorated.

The resin composition of this invention may contain a curing catalyst for the purpose of promoting the curing reaction between an epoxy compound constituting the (a) component and a curing agent constituting the (b) component. For example, a basic compound, an organic phosphine compound, an imidazole compound or the derivatives thereof, DBU (1,8-diazabicyclo(5,4,0) undecene-7) or the salt of DBU may be employed.

Examples of the basic compound include tertiary amines such as benzyl dimethylamine, $\alpha$-methylbenzyldimethylamine, dimethylaminomethyl phenol, tris-dimethylaminomethyl phenol, and the salts or complex comounds thereof.

Examples of organic phosphine are trimethyl phosphine, triethyl phosphine, tributyl phosphine, triphenyl phosphine, tri(p-methylphenyl) phosphine, tri(nonylphenyl) phosphine, methyldiphenyl phosphine, dibutylphenyl phosphine, tricyclohexyl phosphine, 1,2-bis(diphenylphosphine) ethane, and bis(diphenylphosphine) methane.

Examples of imidazole compound are imidazole, 2-methylimidazole, 2,4-dimethylimidazole, 2-ethyl-4-methylimidazole, 2-phenylimidazole, 2-phenyl-4-methylimidazole, and 2-heptadecylimidazole.

Examples of the phenol salt of DBU include SA-853 (Sanabro).

It is also possible to employ as a curing catalyst a potential catalyst such as Novacure HX-3722, HX-3721, HX-3748, HX-3741, HX-3742, and HX-3088 (Asahi Chemical Industry Co., Ltd.) or MY-25 (Ajinomoto Co.).

The mixing ratio of the aforementioned curing catalysts in the resin composition according to this invention should preferably be in the range of 0.1 to 10 parts by weight per 100 parts by weight of the total amount of an epoxy compound constituting the (a) component and a curing agent constituting the (b) component. If the content of curing catalyst is less than 0.1 part by weight, the curing of the resin composition may become insufficient so that the heat resistance, etc. of the resultant cured product, the encapsulated resin-molded product may be deteriorated. On the other hand, if the content of the curing catalyst exceeds over 10 parts by weight, the heat resistance, moisture resistance and electric properties of the resultant cured product may be deteriorated. A more preferable mixing ratio of the curing catalyst is 0.5 to 5 parts by weight per 100 parts by weight of the total amount of the (a) component and (b) component.

The resin composition according to this invention may include an adhesion-promoting agent for the purpose of improving the adhesion of the resin composition after curing thereof to a substrate. Examples of such an adhesion-promoting agent are a thermosetting resin such as amino resin, polyurethane resin and unsaturated polyester; an isocyanate compound; rubber; silane compound and a metallic chelate compound.

Out of these compounds, the metallic chelate compound is effective in improving not only the adhesion with a semiconductor element, but also the water resistance of the cured resin. Examples of such a metallic chelate compound are Zr chelate, Ti chelate and Al chelate.

Specific examples of Zr chelate are tetrakisacetylacetonato zirconium, monobutoxytrisacetylacetonato zirconium, dibutoxybisacetylacetonato zirconium, tributoxyacetylacetato zirconium, tetrakisethylacetylacetate zirconium, butoxytrisethylacetylacetate zirconium, tributoxymonoethylacetylacetate zirconium, tetrakisethyl lactate zirconium, dibutoxybisethyl lactate zirconium, bisacetylacetonato bisethylacetylacetonato zirconium, monoacetylacetonato trisethylacetylacetonato zirconium, monoacetylacetonato bisethylacetylacetonato zirconium, and bisacetylacetonatobisethyl lactonato zirconium. As for the Ti chelate and Al chelate, a compound having a ligand such as β-diketone, hydroxycarboxylic acid, ketoester, ketoalcohol and glycol may be employed.

When a thermosetting resin or rubber is employed as an adhesion-promoting agent in the resin composition of this invention, the mixing ratio of the thermo-setting resin or rubber should preferably be 0.2 to 20% by weight based on the resin composition. If the mixing ratio is less than 0.2% by weight, a sufficient effect of the adhesion-promoting agent would not be obtained. On the other hand, if the mixing ratio exceeds over 20% by weight, the water absorption of the cured material become too high or the heat resistance of the molded product would be deteriorated. When a metallic chelate is employed as an adhesion-promoting agent in the resin composition of this invention, the mixing ratio of the metallic chelate should preferably be 0.01 to 5% by weight based on the resin composition. If the mixing ratio is less than 0.01% by weight, a sufficient effect of the metallic chelate would not be obtained. On the other hand, if the mixing ratio exceeds over 5% by weight, the interconnecting wirings of semiconductor elements may be eroded due to the ionic impurities, or the electric insulation of the molded product would be deteriorated when the resin composition is applied to a resin-encapsulated semiconductor device.

Additionally, other additives such as a flame retardant such as antimony trioxide, a phosphorus compound and a halogen-containing compound; a releasing agent such as natural wax, synthetic wax, linear fatty acid or metal salts thereof, acid amides, esters and paraffins; a pigment such as carbon black and titanium dioxide; and a surface-treating agent such as silane coupling agent may be added to the resin composition of this invention. Furthermore, a stress-relieving agent such as silicone rubber, silicone oil, various kinds of plastic powder, engineering plastic powder, ABS resin powder and MBS resin powder may be incorporated into the resin compound of this invention.

There is much possibility that the epoxy resin constituting the (a) component and the polysiloxane resin constituting the (b) component may be contaminated with impurities such as alkaline metal ions or halogen ions in the resin composition of this invention. It is also conceivable that unreacted alkyl halide, aryl halide or chlorosilanes may be left in the resin composition, or halide compounds may be generated in a side reaction. It is known that when a resin composition containing these impurities is employed for sealing a semiconductor element, it will give rise to the disconnection of interconnecting wirings due to the erosion of aluminum wiring or the deterioration of moisture resistance. Therefore, the removal of these impurities from the resin composition is strongly desired.

These impurities can be effectively removed by a process wherein a resin composition containing these impurities is dissolved in a water-soluble polar solvent such as N-methylpyrolidone, N,N-dimethylacetoamide, tetrahydrofuran (THF), acetone or ethanol thereby forming a resin solution, which is then dripped into a large quantity of water or into a diluted aqueous solution of an organic acid such as oxalic acid, and the resultant precipitated polymer is collected through filtration. It is also possible to remove these impurities by a process wherein a resin composition containing these impurities is dissolved in an organic solvent which is incapable of being intermixed with water such as diethyl ether, ethyl acetate or a chlorine-based organic solvent, then water or a diluted aqueous solution of an organic acid is added to the solution of the resin, the resultant mixed solution is left to stand after being shaken, thus separating the mixed solution into an organic solvent phase and an aqueous phase, and the organic solvent phase is collected thereby removing these impurities. These processes can be repeated until the concentrations of alkaline metals or halogen impurities are reduced to the predetermined acceptable concentrations. Namely, the concentration of alkaline metals contained as an impurity in the synthesized resin should preferably be limited to 50 ppm or less, more preferably 20 ppm or less, most preferably 5 ppm or less. On the other hand, the concentration of halogen compounds contained as an impurity in the resin should preferably be limited to 500 ppm or less, more preferably 300 ppm or less, most preferably 100 ppm or less.

If an LC or LSI is to be directly mounted on a substrate, the sealing material is required to be liquid. It is possible according to this invention to obtain a liquid resin composition having a high reliability by suitably combining an (a) component having a low melting point with a (b) component having a low melting point. For example, when an (a) component which is liquid or oily at room temperature and a (b) component is liquid or oily at room temperature are combined, a liquid resin composition can be obtained. If the liquid resin composition is to be employed as a liquid sealing material, the viscosity of the resin composition should preferably be 5 Pa·S or less at a temperature of 100° C. Because, if the viscosity of the resin composition exceeds over 5 Pa·S, the filling of the resin composition into the space between a substrate and a semiconductor element would become difficult, thus requiring a long period of time for filling the resin composition. Moreover, if the viscosity of the resin composition exceeds over 5 Pa·S, an unfilled portion would be generated in a resin-encapsulated semiconductor device, whereby not only giving rise to a defective insulation of the device, but also causing the semiconductor element to be easily separated from the substrate. By the way, a preferable viscosity of the resin composition at room temperature is 20 Pa·S or less, more preferably 10 Pa·S or less.

Although there is any particular limitation regarding the lower limit of viscosity of the resin composition, it is preferably that the viscosity of the resin composition at a temperature of 100° C. should be 1 mPa·S or more, since burr may be generated on a cured product if the resin composition is excessively low in viscosity.

If desired for the purpose of adjusting the viscosity of the resin composition of this invention, an organic solvent or a reactive diluting agent may be employed. Unlimitative examples of the organic solvent useful in this case are a ketone type solvent such as cyclohexanone, acetone, methyl ethyl ketone and methylisobutyl ketone; a cellosolve type solvent such as methylcellosolve, ethylcellosolve, methylcellosolve acetate and ethylcellosolve acetate; and an ester type solvent such as ethyl acetate, butyl acetate, isoamyl acetate and ethyl lactate. These solvents may be employed singly or in combination of two or more kinds.

As for the reactive diluting agent, an epoxy monomer or a low molecular compound having a cross-linkable unsaturated carbon-carbon bond can be employed. Specific examples of epoxy monomer are glycidol, 1,2,7,8-diepoxy octane, 1,4-butanediol gylcidyl ether, cyclohexane oxide, 2,3-epoxynorbornene, 4-vinylcyclohexanone monooxide, limonene oxide, cyclododecane oxide, 4-vinylcyclohexane dioxide, 1,2,5,6-diepoxycyclooctane, cyclooctane oxide, pinene oxide, 1,2-epoxy-5,9-cyclododecadiene, 1,2-epoxyethylbenzene, stilbene oxide, glycidylphenyl ether, p-tert-butylphenylglycidyl ether, 2,3-epoxypropyl-p-methoxyphenyl ether, and o-biphenylglycidyl ether.

Specific examples of the low molecular compound having a cross-linkable unsaturated carbon-carbon bond are diethylene glycol diallyl ether, N,N'-methylenebisacryl amide, diallyl chlorendate, diallyl hexahydrophthalate, triallyl trimellitate, 4-allyl-2,6-di-tert-butylphenol, diallylisophthalate, diallylphthalate, divinylbenzene, styrene, allylbenzene, divinylsulfone, allylbenzene carboxylate, 4-vinylphenyl, triallyl-1,3,5-benzene tricarboxylate, 2-ethylhexyl acrylate, 2-hydroxyethyl acrylate, 2-hydroxypropyl acrylate, tetrahydrofurfuryl acrylate, phenoxyethyl acrylate, nonylphenoxyethyl acrylate, tetrahydrofurfuryloxyethyl acrylate, tetrahydrofurfuryloxyhexanolide acrylate, $\epsilon$-caprolactone adduct acrylate of 1,3-dioxane alcohol, 1,3-dioxorane acrylate, hexanediol acrylate, neopentylglycol diacrylate, diethylleneglycol diacrylate, tripropyleneglycol diacrylate, polyethyleneglycol diacrylate, hydroxypivalic neopentylglycol diacrylate, neopentylglycoladipate diacrylate, hydroxypivalic neopentylglycol $\epsilon$-caprolactone adduct diacrylate, 2(2-hydroxy-1,1-dimethylethyl)-5-hydroxymethyl-5-ethyl-1,3-dioxane diacrylate, tricyclodecanedimethylol diacrylate, 1,6-hexanediol diglycidylether diacrylate, trimethylolpropane triacrylate, propionic dipentaerythritol triacrylate, propionic dipentaerythritol tetraacrylate, ditrimethylolpropane tetraacrylate, propionic dipentaerythritol pentaacrylate, dipentaerythritol hexaacrylate, and dipentaerythritol hexaacrylate $\epsilon$-caprolactone adduct.

If the aforementioned compound having a cross-linkable unsaturated carbon-carbon bond is to be employed as a reactive diluting agent, a peroxide or an azo compound can be employed as a curing catalyst.

Examples of peroxide are diallyl peroxides, peroxide esters, diacyl peroxides, hydroperoxides, ketone peroxides and peroxyketals. Specific examples of them are benzoyl peroxide, parachlorobenzoyl peroxide, 2,4-dichlorobenzoyl peroxide, caprylyl peroxide, lauroyl peroxide, acetyl peroxide, methylethylketone peroxide, cyclohexanone peroxide, bis(1-hydroxycyclohexyl peroxide), hydroxyheptyl peroxide, t-butylhydroperoxide, p-menthanehydroperoxide, cumenehydroperoxide, 2,5-dimethylhexyl-2,5-dihydroperoxide, di-t-butyl peroxide, dicumyl peroxide, 2,5-dimethyl-2,5-di(t-butylethyloxy) hexane, 2,5-dimethylhexyl-2,5-di(peroxybenzoate), t-butylperbenzoate, t-butylperacetate, t-butylperoctoate, t-butylperoxyisobutylate, and di-t-butylperphthalate.

As for the azo compound, azobisisobutylonitrile, 2,2'-azobispropane, m,m'-azoxostyrene or hydrazone can be employed.

The resin composition of this invention can be prepared as follows. Namely, the whole components are thoroughly intermixed by means for example of Henschel mixer, and then subjected to a melt-mixing treatment using a hot roll or a biaxial extruder, the resultant melt being subsequently cooled to room temperature and pulverized using a hammer mill. If the resin composition to be employed is liquid, the pulverization treatment can be dispensed with.

As for the method of sealing a semiconductor element with a resin composition of this invention, a low pressure transfer molding which is generally employed can be employed. However, the sealing method is not restricted to the transfer molding, but any other sealing methods such as a compression molding, an injection molding, a cast molding or potting can be employed for sealing a semiconductor element. By the term "sealing (or encapsulating)" employed herein, it is intended to include so-called one-side sealing where a resin layer is interposed between a semiconductor element and a substrate. The thermal curing after the sealing should preferably be performed at a temperature of not less than 150° C. There are no limitations regarding the kinds and size of the semiconductor element to be sealed with the cured material of the resin composition according to this invention.

The resin composition according to this invention can be applied not only to the sealing of a semiconductor element, but also to the manufacture of a molded product which is desired to have an excellent heat resistance.

The present inventors have found that it is possible to obtain a resin composition which is suited for sealing and capable of overcoming all of the conventional problems by making use of a polysiloxane resin having on its side chain a phenolic hydroxyl group as a curing agent for an epoxy compound, thus accomplishing the present invention. Namely, the resin composition comprising an epoxy resin and a curing agent containing a polysiloxane resin having on its side chain a phenolic hydroxyl group according to this invention is capable of alleviating a stress that might be applied to the cured product thereof without increasing water absorption of the cured product. Therefore, if a resin-encapsulated semiconductor device is manufactured by making use of the resin composition according to this invention, the moisture resistance reliability of the device would never be deteriorated. Further, the resin-encapsulated semiconductor device to be obtained according to this invention is excellent in adhesion and in thermal shock resistance. Furthermore, it is possible to obtain not only a solid polysiloxane but also any desired liquid polysiloxane by suitably selecting the structure and molecular weight of the polysiloxane resin having on its side chain a phenolic hydroxyl group, thereby making it possible to suitably control the viscosity and melting temperature of the resin composition. Thus, it is also possible to obtain a liquid resin composition which is excellent in reliability and suited for use in a surface-mounting, i.e. in the manufacture of a flip chip, a CSP (chip size package) or a BGA (ball grid array).

Additionally, since the phenol in polysiloxane resin is allowed to react with epoxy compound according to the resin composition of this invention, there is no possibility that the surface of metal mold would be soiled due to the oozing of silicone oil as seen in the case where silicone oil is added to a resin composition. Therefore, it is possible according to this invention to provide a resin composition having an excellent property which is suited for sealing a semiconductor element.

This invention will be further explained with reference to the following examples.

A resin composition was prepared as follows. First of all, an inorganic filler was treated with a surface treatment agent in a Henshel mixer. Then, an epoxy compound, a plysiloxane resin, a curing catalyst and a curing agent were mixed together according to the formulations shown in Table 1. Then, the mixture were thermally fused thereby homogeneously mixing them, then cooled and pulverized. Then, the whole components were mixed together and kneaded using a hot roll heated to 60 to 160°, the resultant kneaded material being subsequently cooled and pulverized to obtain various kinds of resin compositions representing Examples 1 to 3 and Comparative Example 1.

TABLE 1

|  | Example | | | Comparative Ex. |
|---|---|---|---|---|
|  | 1 | 2 | 3 | 1 |
| (a) Components | A1 | A2 | A3 | A2 |
|  | 17.0 | 6.7 | 6.0 | 7.7 |
| (b) Components |  |  |  |  |
| Polysiloxane resin | B1 | B2 | B3 | — |
|  | 9.6 | 2.5 | 3.7 |  |
| Other curing agent | — | D1 | D1 | D1 |
|  |  | 2.4 | 1.9 | 3.9 |
| (c) Components |  |  |  |  |
| Inorganic filler | 70 | 85 | 85 | 85 |
| Curing catalyst | 0.2 | 0.2 | 0.2 | 0.2 |
| Die lubricant | 0.5 | 0.5 | 0.5 | 0.5 |
| Pigment | 0.4 | 0.4 | 0.4 | 0.4 |
| Surface-treating agent | 0.3 | 0.3 | 0.3 | 0.3 |
| Flame-retardant | 2.0 | 2.0 | 2.0 | 2.0 |
| Reactive diluent | — | — | — | — |

The epoxy compounds A1 to A3 shown in Table 1, each constituting the (a) component, denote the following compounds.

A1: o-cresol novolak epoxy resin (epoxy equivalent: 197)
A2: bisphenol A type epoxy resin (epoxy equivalent: 190)
A3: biphenyl type epoxy resin (epoxy equivalent: 191)

The polysiloxane resins B1, B2 and B3 to be incorporated respectively into the curing agent constituting the (b) component denote the following resins having repeating units represented by the aforementioned chemical formulas (1), (9) and (18). The weight average molecular weight, softening point and phenol equivalent of each polysiloxane resin are summarized in the following Table 2.

TABLE 2

|  | Repeating unit | Weight average molecular weight | Softening point/° C. | Phenol equivalent |
|---|---|---|---|---|
| B1 | (1) | 4000 | 70 | 115 |
| B2 | (9) | 3500 | 50 | 256 |
| B3 | (18) | 5000 | 65 | 287 |

The curing agent D1 which is not a polysiloxane resin denotes the following compound.

D1: phenol novolak resin (phenol equivalent: 104)
Other components employed are as follows.
Reactive diluent: 1,2-epoxy-3-phenoxypropane
Curing catalyst: triphenyl phosphine
Release agent: carnauba wax
Pigment: carbon black
Flame retardant: antimony trioxide
Inorganic filler: C1 fused silica powder (spherical; average particle diameter: 20 μm; maximum particle diameter: 75 μm)
Surface treatment agent: γ-glycidoxypropyltrimethoxy silane (A-187, Nippon Unicar Co., Ltd.)
Furthermore, the following compounds were employed as the (a) component, (b) component or (c) component, and other predetermined components were added thereto, the resultant mixture being treated according to procedures explained below to prepare the resin compositions of Examples 4, 5 and 6, and Comparative Examples 2 and 3 and Sample.

(a) component:
A4: bisphenol F type epoxy resin (epoxy equivalent: 170)
A5: (3',4'-epoxycyclohexylmethyl)-3,4-epoxydicyclohexane carboxylate (epoxy equivalent: 126)

(b) component:
B4: a copolymer of siloxane having a repeating unit represented by the aforementioned chemical formula (27) and dimethyl siloxane (copolymerization ratio= 1:5); weight average molecular weight: 800
B5: a copolymer of siloxane having a repeating unit represented by the aforementioned chemical formula (11) and dimethyl siloxane (copolymerization ratio= 1:8); weight average molecular weight: 1,200
B6: a copolymer of siloxane having a repeating unit represented by the aforementioned chemical formula (27) and dimethyl siloxane (copolymerization ratio= 1:2); weight average molecular weight: 550

These components B4, B5 and B6 are liquid at room temperature.
Other curing agents:
D2: methylhexahydrophthalic anhydride
D3: 3,3'-diallyl-4,4'-dihydroxy diphenyl methane (c) component:
C2: silica (average particle diameter=2.7 μm; maximum particle diameter=30 μm)
C3: silica (average particle diameter=5.1 μm; maximum particle diameter=30 μm)
C4: silica (average particle diameter=4.1 μm; maximum particle diameter=30 μm)
C5: silica (average particle diameter=52 μm; maximum particle diameter=100 μm)

Curing catalyst: Novacure HX3088 (Asahi Chemical Industry Co., Ltd.)
Reactive diluent: phenylglycidyl ether
Pigment: carbon black
Dye: a black dye

EXAMPLE 4

(a) component: A4 20.4 parts by weight
(b) component: B4 10.7 parts by weight
other curing agent: D2 16.0 parts by weight
(c) component: C2 50.0 parts by weight
Curing catalyst: 2.5 parts by weight
Pigment: 0.4 parts by weight First of all, the (a) component, the (b) component, the (c) component and the pigment were mixed together and then kneaded by means of a rotation type kneading apparatus (Shinky Co., Ltd.; HX201) to obtain a mixture. Then, a curing catalyst was added to the mixture, and the resultant mixture was kneaded again using the aforementioned kneading apparatus to obtain a resin composition. The resin composition thus obtained was liquid at room temperature, the viscosity of the resin composition being 3 Pa·S at room temperature and 0.2 Pa·S at a temperature of 100° C.

EXAMPLE 5

(a) component: A4 21.8 parts by weight
(b) component: B5 10.8 parts by weight other curing agent: D3 14.5 parts by weight
(c) component: C2 50.0 parts by weight
Curing catalyst: 2.5 parts by weight
Dye: 0.4 parts by weight First of all, the (a) component, the (b) component, the (c) component and the dye were mixed together and then kneaded by means of a three-roll mill to obtain a mixture. Then, a curing catalyst was added to the mixture, and the resultant mixture was kneaded again using the aforementioned mill to obtain a resin composition. The resin composition thus obtained was liquid at room temperature, the viscosity of the resin composition being 7 Pa·S at room temperature and 0. 8 Pa·S at a temperature of 100° C.

EXAMPLE 6

(a) component: A5 14.6 parts by weight
(b) component: B6 8.6 parts by weight
other curing agent: D3 12.2 parts by weight
(c) component: C4 60.0 parts by weight
Reactive diluent: 4.0 parts by weight
Curing catalyst: 0.2 parts by weight
Dye: 0.4 parts by weight First of all, the (a) component, the (b) component, the (c) component, the reactive diluent and the dye were mixed together and then kneaded by means of a three-roll mill to obtain a mixture. Then, a curing catalyst was added to the mixture, and the resultant mixture was kneaded again using the aforementioned mill to obtain a resin composition. The resin composition thus obtained was liquid at room temperature, the viscosity of the resin composition being 6 Pa·S at room temperature and 0. 6 Pa·S at a temperature of 100° C.

Comparative Example 2

(a) component: A4 40.8 parts by weight
(b) component: B4 21.4 parts by weight
other curing agent: D2 32.0 parts by weight
(c) component: 0.0 parts by weight
Curing catalyst: 5.0 parts by weight
Pigment: 0.8 parts by weight First of all, the (a) component, the (b) component and the pigment were mixed together and then kneaded by means of a rotation type kneading apparatus (Shinky Co., Ltd.; HX201) to obtain a mixture. Then, a curing catalyst was added to the mixture, and the resultant mixture was kneaded again using the aforementioned kneading apparatus to obtain a resin composition. The resin composition thus obtained was liquid at room temperature, the viscosity of the resin composition being 0.3 Pa·S at room temperature and 0.01 Pa·S at a temperature of 100° C.

Comparative Example 3

(a) component: A4 26.5 parts by weight
(b) component: 0.0 parts by weight
other curing agent: D3 20.6 parts by weight
(c) component: C3 50.0 parts by weight
Curing catalyst: 2.5 parts by weight
Dye: 0.4 parts by weight First of all, the (a) component, the curing agent, the (c) component and the dye were mixed together and then kneaded by means of a three-roll mill to obtain a mixture. Then, a curing catalyst was added to the mixture, and the resultant mixture was kneaded again using the aforementioned mill to obtain a resin composition. The resin composition thus obtained was liquid at room temperature, the viscosity of the resin composition being 36 Pa·S at room temperature and 4.4 Pa·S at a temperature of 100° C.

Sample (a) component: A4 20.4 parts by weight
(b) component: B4 10.7 parts by weight
other curing agent: D3 16.0 parts by weight
(c) component: C5 50.0 parts by weight
Curing catalyst: 2.5 parts by weight
Pigment: 0.4 parts by weight First of all, the (a) component, the (b) component, the (c) component and the pigment were mixed together and then kneaded by means of a rotation type kneading apparatus (Shinky Co., Ltd.; HX201) to obtain a mixture. Then, a curing catalyst was added to the mixture, and the resultant mixture was kneaded again using the aforementioned kneading apparatus to obtain a resin composition. The resin composition thus obtained was liquid at room temperature, the viscosity of the resin composition being 2.6 Pa·S at room temperature and 0.1 Pa·S at a temperature of 100° C.

The characteristics of the resin compositions thus obtained were evaluated as follows. First of all, the following evaluation tests were conducted on the resin compositions of these Examples 1 to 3 and Comparative Example 1.

(1) Test pieces (8 mm×8 mm×4 mm) of each resin composition were prepared by way of transfer molding under the conditions of 175° C. and three minutes, the resultant molded pieces being after-cured over 4 hours at a temperature of 220° C. Flexural modulus, flexural strength, thermal expansion coefficient, glass transition point and water absorption were measured on each test piece. Further, each resin composition was molded on a frame material (42 alloy) to prepare a test piece, and the adhesion strength in the direction of pull was also measured on each test piece. The results obtained by these tests are shown in Table 3 below.

(2) For the purpose of investigating the moisture resistance of these resin compositions, the following PCT test was performed. Namely, each resin composition was used to prepare a test device (8 mm×8 mm) which was sealed according to the TQFP package. Then, the test device was subjected to after-curing over 4 hours at a temperature of 220° C. to prepare a resin-encapsulated semiconductor device. Each of the resin-encapsulated semiconductor devices was then left in an atmosphere 85% in relative humidity and 85° C. in temperature for 72 hours, thus performing a moisture absorption treatment. Then, the resin-molded semiconductor device was exposed to a fluorocarbon vapor atmosphere heated to 125° C. for one minute to investigate the ratio of generating cracks in the package at this stage. Furthermore, this resin-encapsulated semiconductor device was left in a saturated water vapor heated to 127° C. for a predetermined period of time to investigate the percent defective (defective due to leakage and defective due to opening), thus evaluating the moisture resistance.

(3) For the purpose of investigating the thermal shock resistance of these resin compositions, the following TCT test was performed. Namely, each resin composition was used to prepare a test device (8 mm×8 mm) of large size for a thermal shock resistance, which was sealed according to the TQFP package. Then, the test device was subjected to after-curing over 4 hours at a temperature of 220° C. to prepare a resin-encapsulated semiconductor device. Each of the resin-encapsulated semiconductor devices was then subjected to a thermal shock cycle, one cycle thereof being consisted of −65° C./room temperature/150° C. This cycle was repeated 50 to 400 times to determine the percent defective by checking the performance characteristics of the device.

The results of these PCT and TCT tests are summarized in Table 4 below.

TABLE 3

|  | Example | | | Comparative Ex. |
|---|---|---|---|---|
|  | 1 | 2 | 3 | 1 |
| Flexural modulus (GPa) | 16 | 18 | 19 | 22 |
| Flexural strength (Mpa) | 154 | 160 | 157 | 128 |
| Thermal expansion coefficient (1/deg) × $10^5$ | 1.5 | 1.2 | 1.2 | 1.2 |
| Glass transition point (° C.) | 132 | 124 | 102 | 122 |
| Water absorption (weight %) | 0.24 | 0.23 | 0.21 | 0.23 |
| Adhesive strength (MPa) | 17 | 15 | 16 | 11 |

TABLE 4

|  |  | Example | | | Comparative Ex. |
|---|---|---|---|---|---|
|  |  | 1 | 2 | 3 | 1 |
| PCT test | Ratio of crack generation after moisture absorption test Percent defective in performance | 0/20 | 0/20 | 0/20 | 0/20 |
|  | 100 hours | 0/20 | 0/20 | 0/20 | 0/20 |
|  | 200 hours | 0/20 | 0/20 | 0/20 | 0/20 |
|  | 300 hours | 0/20 | 0/20 | 0/20 | 1/20 |
|  | 400 hours | 0/20 | 0/20 | 0/20 | 2/20 |
|  | 500 hours | 0/20 | 0/20 | 0/20 | 5/20 |
| TCT test | 50 cycles | 0/20 | 0/20 | 0/20 | 0/20 |
|  | 100 cycles | 0/20 | 0/20 | 0/20 | 0/20 |
|  | 200 cycles | 0/20 | 0/20 | 0/20 | 1/20 |
|  | 300 cycles | 0/20 | 0/20 | 0/20 | 4/20 |
|  | 400 cycles | 0/20 | 0/20 | 0/20 | 5/20 |

As clearly seen from Table 3, the test pieces of the resin compositions of this invention (Examples 1 to 3) exhibited excellent flexural strength and the adhesion strength as compared with those of Comparative Example 1. In particular, it has been found that the adhesion strength can be prominently improved by incorporating a curing agent containing a polysiloxane resin.

As apparent from Table 4, any defective was not found in the resin-encapsulated semiconductor devices according to Examples 1 to 3 of this invention even if the resin-molded semiconductor devices were left under a high temperature and high moisture condition for 500 hours, thus demonstrating an excellent moisture resistance of the resin-encapsulated semiconductor devices of this invention. By contrast, in the case of the resin-encapsulated semiconductor devices according to Comparative Example 1 where the semiconductor devices were sealed by making use of a resin composition not containing a polysiloxane having a phenolic hydroxyl group on its side chain, defectives could be found in some of the devices after 300 hours of the test, and one fourth of the devices become defective after 500 hours of the test.

As seen from the results of the TCT test shown in Table 4, any defective could not be found in the resin-molded semiconductor devices according to Examples of this invention even if the resin-encapsulated semiconductor devices were subjected to the thermal shock cycle which was repeated 400 times. By contrast, in the case of the resin-encapsulated semiconductor devices according to Comparative Example 1, defectives could be found in some of the devices after 200 cycles of the shock, and one fourth of the devices become defective after 400 cycles of the shock.

As illustrated above, the cured products of the resin compositions according to this invention indicated excellent results in all respects including a mechanical strength, thus demonstrating that the resin-encapsulated semiconductor device sealed with the resin compositions according to this invention would exhibit prominently high moisture resistance and thermal shock resistance.

By the way, any degree of soil due to oozing of the polysiloxane could not be admitted on the interior of the metal mold after the molding of the resin compositions in any of Examples 1 to 3.

The liquid resin compositions obtained in Examples 4, 5 and 6, as well as in Comparative Examples 2 and 3 and Sample were molded respectively into a sheet having a thickness of 4 mm, which was then cured by heating it at a temperature of 180° C. for 5 hours thereby to obtain test pieces (4 mm×10 mm×100 mm). Then, the flexural modulus and flexural strength of these test pieces were measured. At the same time, thermal expansion coefficient, glass transition point and water absorption of these test pieces were measured after cutting the cured test pieces into a suitable size.

Further, each resin composition was slightly coated on a substrate formed of BT resin, and then a silicon wafer (3 mm×3 mm) was placed on the substrate. The resin composition coated in this manner was heated at a temperature of 150° C. for one hour to cure the resin composition, thus preparing test pieces. Then, the adhesion strength in the direction of compression was measured on each test piece. The results obtained by these tests are shown in Table 5 below.

Resin-encapsulated semiconductor devices were prepared as follows by making use of the resin compositions obtained in Examples 4, 5 and 6, as well as in Comparative Examples 2 and 3 and Sample. First of all, a solder bump was formed on the pad portion of an LSI flip chip (10 mm×10 mm; the height of the bump: 50 $\mu$m). Then, the resultant chip was mounted on a circuit board and fixed thereto by means of thermocompression bonding. On the other hand, the resin compositions obtained in Examples 4, 5 and 6, as well as in Comparative Examples 2 and 3 and Sample were respectively charged into a syringe, and then allowed to flow into one side of the chip which had been heated in advance on a hot plate heated to 60° C. The resin compositions thus applied was introduced into the space between the chip and the substrate due to the capillary phenomenon. In the case of the resin compositions according to Examples 4 to 6 and Comparative Example 2, the filling of the resin compositions was finished within 5 minutes, whereas in the case of the resin compositions according to Comparative Examples 3 and Sample, a time period of 12 minutes was required for accomplishing the filling and even a time period of as long as 30 minutes was not enough for accomplishing the filling, respectively. After finishing the filling of the resin compositions, they were heated in an oven at a temperature of 150° C. for one hour thereby to cure the resin compositions, thus obtaining flip chip semiconductor devices.

Then, the flip chip semiconductor devices thus obtained were evaluated by way of the PCT and TCT tests which were conducted in the same manner as in the case of Examples 1 to 3. The results obtained are summarized in the following Table 6.

TABLE 5

|  | Example | | | Comparative Ex. | | |
| --- | --- | --- | --- | --- | --- | --- |
|  | 4 | 5 | 6 | 2 | 3 | Sample |
| Flexural modulus (GPa) | 8.4 | 7.3 | 9.2 | 2.6 | 11.3 | 8.2 |
| Flexural strength (MPa) | 144 | 150 | 136 | 102 | 138 | 140 |
| Thermal expansion coefficient (1/deg) × $10^5$ | 3.3 | 3.2 | 2.8 | 7.2 | 3.4 | 3.5 |
| Glass transition point (° C.) | 112 | 103 | 110 | 111 | 125 | 110 |
| Water absorption (Weight %) | 0.56 | 0.52 | 0.46 | 1.10 | 0.58 | 0.57 |
| Adhesive strength (MPa) | 35 | 32 | 40 | 23 | 14 | 24 |

TABLE 6

| | | Example | | | Comparative Example | | |
| --- | --- | --- | --- | --- | --- | --- | --- |
| | | 4 | 5 | 6 | 2 | 3 | Sample |
| PCT test | Ratio of crack generation after moisture absorption test Percent defective in performance | 0/20 | 0/20 | 0/20 | 3/20 | 0/20 | 20/20 |
| | 100 hours | 0/20 | 0/20 | 0/20 | 5/20 | 2/20 | — |
| | 200 hours | 0/20 | 0/20 | 0/20 | 12/20 | 2/20 | — |
| | 300 hours | 0/20 | 0/20 | 0/20 | 20/20 | 2/20 | — |
| | 400 hours | 0/20 | 0/20 | 0/20 | — | 2/20 | — |
| | 500 hours | 0/20 | 0/20 | 0/20 | — | 3/20 | — |
| TCT test | 0 cycle (After curing) | 0/20 | 0/20 | 0/20 | 5/20 | 5/20 | 20/20 |
| | 50 cycles | 0/20 | 0/20 | 0/20 | 20/20 | 8/20 | — |
| | 100 cycles | 0/20 | 0/20 | 0/20 | — | 13/20 | — |
| | 200 cycles | 0/20 | 0/20 | 0/20 | — | 20/20 | — |
| | 200 cycles | 0/20 | 0/20 | 0/20 | — | — | — |
| | 400 cycles | 0/20 | 0/20 | 0/20 | — | — | — |

As seen from Table 5, the test pieces of the resin compositions of this invention (Examples 4, 5 and 6) exhibited excellent flexural strength and the adhesion strength as compared with those of Comparative Examples. It is clear from the comparison on flexural modulus between the resin composition of Example 5 and the resin composition of Comparative Example 3, both of which were the same with respect to the amount of filler, that the resin composition of Example 5 where polysiloxane was included as the (b) component indicated a lower flexural modulus as compared with that of Comparative Example 3, suggesting that the stress is much more alleviated in the test piece of Example 5.

As apparent from the results shown in Table 6, any defective was not found in the resin-encapsulated semiconductor devices according to Examples 4 and 5 of this invention even if the resin-molded semiconductor devices were left under a high temperature and high moisture condition for 500 hours, thus demonstrating an excellent moisture resistance of the resin-encapsulated semiconductor devices of this invention. By contrast, in the case of the resin-encapsulated semiconductor device according to Comparative Example 2 where the semiconductor devices were sealed by making use of a resin composition not containing an inorganic filler, defectives could be found in all of the devices after 300 hours of the test. In the case of Sample where a resin composition containing inorganic filler of large particle diameter was employed, the resin composition could not be sufficiently introduced into the gap, so that defectives could be found in all of the devices immediately after the curing of the resin composition.

As seen from the results of the TCT test shown in Table 6, any defective could not be found in the resin-molded semiconductor devices according to Examples of this invention after 400 cycles of the shock, indicating an excellent thermal shock resistance. By contrast, in the case of the resin-encapsulated semiconductor devices according to Comparative Example 2 where an inorganic filler was not contained, defectives could be found in some of the devices after 50 cycles of the shock, while in the case of the resin-encapsulated semiconductor devices according to Comparative Example 3 where polysiloxane constituting the (b) component was not included therein, defectives could be found in some of the devices after 200 cycles of the shock. Further, in the case of the resin-encapsulated semiconductor devices according to Sample where an inorganic filler of large particle diameter was incorporated therein, malfunctioning could be found in all of the devices immediately after the curing of the resin composition.

As mentioned above, it is possible according to this invention to a liquid resin composition by suitably selecting the kinds and mixing ratio of components to be employed. When a liquid resin composition is employed, the filling time thereof would be shortened, and at the same time, a flip chip type semiconductor device which is excellent in moisture resistance and in thermal shock resistance as illustrated above would be obtained. It is also possible to employ a liquid resin composition of this invention as a potting resin or as an adhesive.

FIG. 1 illustrates a sectional view showing one example of the resin-encapsulated semiconductor device of this invention. Referring to FIG. 1, in the resin-encapsulated semiconductor device 10 of this invention, a semiconductor element 1 is mounted on a substrate 2, and the bonding pad 3 formed on the surface of the semiconductor element 1 is electrically connected via bonding wires 5 with the lead frame 4. This structure is entirely sealed with a resin layer 6 consisting of the cured material of the resin composition of this invention.

The resin-encapsulated semiconductor device 10 of this invention constructed in this manner is excellent in heat resistance, thermal shock resistance and moisture resistance reliability as mentioned above, and at the same time, free from problem that any component thereof may ooze out of the surface thereof to damage the outer appearance thereof.

Figure 2:
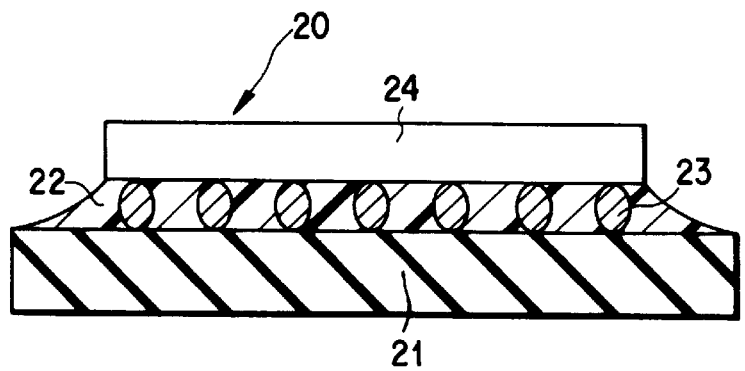
FIG. 2 is a sectional view showing another example of the resin-encapsulated semiconductor device of this invention.

FIG. 2 illustrates a sectional view showing another example of the resin-encapsulated semiconductor device of this invention. In the case of the semiconductor device shown in FIG. 2, a semiconductor chip 24 is mounted, in a face-down style and via a bump 23, on the surface of a substrate 21. A resin layer 22 consisting of the cured material of the resin composition of this invention is interposed in the space between the substrate 21 and the semiconductor chip 24.

Figure 3:
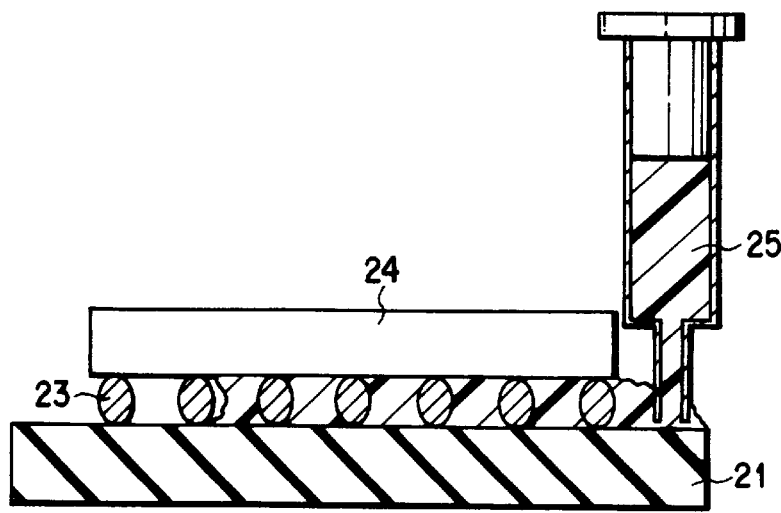
FIG. 3 is a sectional view showing one example of the manufacturing step of the resin-encapsulated semiconductor device shown in FIG. 2.

The flip chip type semiconductor device shown in FIG. 2 can be manufactured by flowing a resin composition into the space formed between the substrate and the semiconductor chip by taking advantage of capillary phenomenon or by applying a pressure. One example of this manufacturing method is schematically shown in FIG. 3. Since the interval between the substrate 21 and the semiconductor chip 24 is as extremely small as 50 to 150 μm, the resin composition 25 to be charged therein is required to be low in viscosity. In the case where the resin composition of this invention is liquid, the resin composition can be easily penetrated into the space between the substrate 21 and the semiconductor chip 24 as shown in FIG. 3, so that the resin composition of this invention is particularly suited for use in the manufacture of a flip chip type semiconductor device.

As explained above, it is possible according to this invention is to provide a resin composition which is low in hygroscopicity, and excellent in moldability and in heat resistance. Further, it is also possible, by making use of a cured material of resin composition according to this invention in the sealing of semiconductor element, to provide a resin-encapsulated semiconductor device which is excellent in heat resistance, in thermal shock resistance and in anti-moisture reliability. Therefore, this invention is very valuable in industrial view point.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A resin composition comprising:
   (a) an epoxy compound;
   (b) a curing agent comprising a polysiloxane resin having a repeating unit represented by the following general formula (PS1); and
   (c) an inorganic filler:

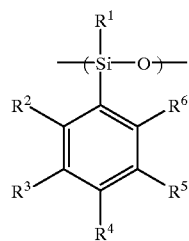

(PS1)

wherein $R^1$ is selected from the group consisting of alkyl group, vinyl group, allyl group, a substituted or unsubstituted aryl group each having 1 to 10 carbon atoms and a substituted or unsubstituted siloxy group; $R^2$ to $R^6$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, allyloxy group, allyl group and a substituted or unsubstituted aryl group, with a proviso that at least one of $R^2$ to $R^6$ is hydroxyl group.

2. The resin composition according to claim 1, wherein said resin composition is liquid at room temperature and a viscosity of said resin composition is 5 Pa·S or less at a temperature of 100° C.

3. The resin composition according to claim 1, wherein a content of said inorganic filler constituting the (c) component is 10 to 95% by weight based on the entire resin composition.

4. The resin composition according to claim 3, wherein a content of said inorganic filler constituting the (c) component is 40 to 90% by weight based on the entire resin composition.

5. The resin composition according to claim 1, wherein a total of the epoxy resin constituting the (a) component and a curing agent constituting the (b) component is 5 to 90% by weight based on the entire resin composition, and at the same time the ratio between the epoxy group (EP) of the (a) component and the phenolic hydroxyl group (phOH) in the (b) component (EP/phOH) is in the range of 1/1.2 to 1/0.2.

6. The resin composition according to claim 1, wherein a maximum particle diameter of said inorganic filler constituting the (c) component is 50 μm or less, and an average particle diameter of said inorganic filler is in the range of from 0.5 to 50 μm.

7. The resin composition according to claim 1, wherein a molecular weight of said polysiloxane resin contained in said (b) component is in the range of from 300 to 50,000.

8. The resin composition according to claim 7, wherein a molecular weight of said polysiloxane resin contained in said (b) component is in the range of from 500 to 30,000.

9. The resin composition according to claim 1, which further comprises as a curing agent at least one kind of compounds selected from the group consisting of amines, acid anhydrides and phenols.

10. The resin composition according to claim 1, wherein said resin composition is solid at a room temperature and a viscosity of said polysiloxane resin is about 5 to 500 Pa·S at a molding temperature.

11. A resin composition comprising:
    (a) an epoxy compound;
    (b) a curing agent comprising a polysiloxane resin having a repeating unit represented by the following general formula (PS2); and
    (c) an inorganic filler;

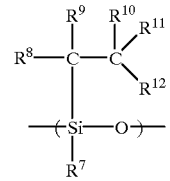

(PS2)

wherein $R^7$ is selected from the group consisting of a substituted or unsubstituted alkyl group having 1 to 10 carbon atoms, a substituted or unsubstituted aryl group having 6 to 14 carbon atoms and a substituted or unsubstituted siloxy group; $R^8$ to $R^{12}$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, acyloxy group, allyloxy group, allyl group, a substituted or unsubstituted aryl group having 6 to 14 carbon atoms, amide group and imide group, with a proviso that at least one of $R^8$ to $R^{12}$ is phenolic hydroxyl group or group having phenolic hydroxyl group, wherein said resin composition is liquid at a room temperature and a viscosity of said resin composition is 5 Pa·S or less at a temperature of 100° C., and wherein a maximum particle diameter of said inorganic filler constituting the (c) component is 50 μm or less, and an average particle diameter of said inorganic filler is in the range of from 0.5 to 50 μm.

12. The resin composition according to claim 11, wherein a content of said inorganic filler constituting the (c) component is 10 to 95% by weight based on the entire resin composition.

13. The resin composition according to claim 12, wherein a content of said inorganic filler constituting the (c) component is 40 to 90% by weight based on the entire resin composition.

14. The resin composition according to claim 11, wherein a total of the epoxy resin constituting the (a) component and a curing agent constituting the (b) component is 5 to 90% by weight based on the entire resin composition, and at the same time the ratio between the epoxy group (EP) of the (a) component and the phenolic hydroxyl group (phOH) in the (b) component (EP/phOH) is in the range of 1/1.2 to 1/0.2.

15. The resin composition according to claim 11, wherein a molecular weight of said polysiloxane resin contained in said (b) component is in the range of from 300 to 50,000.

16. The resin composition according to claim 15, wherein a molecular weight of said polysiloxane resin contained in said (b) component is in the range of from 500 to 30,000.

17. The resin composition according to claim 11, which further comprises as a curing agent at least one kind of compound selected from the group consisting of amines, acid anhydrides and phenols.

18. A resin composition comprising:
(a) an epoxy compound;
(b) a curing agent comprising a polysiloxane resin having a repeating unit represented by the following general formula (PS2); and
(c) an inorganic filler;

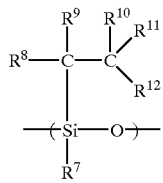

(PS2)

wherein $R^7$ is selected from the group consisting of a substituted or unsubstituted alkyl group having 1 to 10 carbon atoms, a substituted or unsubstituted aryl group having 6 to 14 carbon atoms and a substituted or unsubstituted siloxy group; $R^8$ to $R^{12}$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, acyloxy group, allyloxy group, allyl group, a substituted or unsubstituted aryl group having 6 to 14 carbon atoms, amide group and imide group,
with a proviso that at least one of $R^8$ to $R^{12}$ is phenolic hydroxyl group or group having phenolic hydroxyl group,
wherein said resin composition is solid at a room temperature and a viscosity of said polysiloxane resin is about 5 to 500 Pa·S at a molding temperature, and
wherein a maximum particle diameter of said inorganic filler constituting the (c) component is 50 μm or less, and an average particle diameter of said inorganic filler is in the range of from 0.5 to 50 μm.

19. The resin composition according to claim 18, wherein a content of said inorganic filler constituting the (c) component is 10 to 95% by weight based on the entire resin composition.

20. The resin composition according to claim 19, wherein a content of said inorganic filler constituting the (c) component is 40 to 90% by weight based on the entire resin composition.

21. The resin composition according to claim 18, wherein a total of the epoxy resin constituting the (a) component and a curing agent constituting the (b) component is 5 to 90% by weight based on the entire resin composition, and at the same time the ratio between the epoxy group (EP) of the (a) component and the phenolic hydroxyl group (phOH) in the (b) component (EP/phOH) is in the range of 1/1.2 to 1/0.2.

22. The resin composition according to claim 18, wherein a molecular weight of said polysiloxane resin contained in said (b) component is in the range of from 300 to 50,000.

23. The resin composition according to claim 22, wherein a molecular weight of said polysiloxane resin contained in said (b) component is in the range of from 500 to 30,000.

24. The resin composition according to claim 18, which further comprises as a curing agent at least one kind of compound selected from the group consisting of amines, acid anhydrides and phenols.

25. A resin-encapsulated semiconductor device comprising a substrate, a semiconductor element disposed on a surface of said substrate and a resin layer disposed between said semiconductor substrate and said semiconductor element;
wherein said resin layer is formed of a cured material of a resin composition comprising (a) an epoxy compound, (b) a curing agent comprising a polysiloxane resin having a repeating unit represented by the following general formula (PS2), and (c) an inorganic filler:

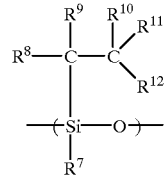

(PS2)

wherein $R^7$ is selected from the group consisting of a substituted or unsubstituted alkyl group having 1 to 10 carbon atoms, a substituted or unsubstituted aryl group having 6 to 14 carbon atoms and a substituted or unsubstituted siloxy group; $R^8$ to $R^{12}$ may be the same or different and are individually selected from the group consisting of hydrogen atom, a halogen atom, a substituted or unsubstituted alkyl group, carboxyl group, alkylcarbonyl group, alkoxycarbonyl group, alkoxy group, acyloxy group, allyloxy group, allyl group, a substituted or unsubstituted aryl group having 6 to 14 carbon atoms, amide group and imide group,
with a proviso that at least one of $R^8$ to $R^{12}$ is phenolic hydroxyl group or group having phenolic hydroxyl group,
wherein said resin composition is liquid at a room temperature and a viscosity of said resin composition is 5 Pa·S or less at a temperature of 100° C., and
wherein a maximum particle diameter of said inorganic filler constituting the (c) component is 50 μm or less, and an average particle diameter of said inorganic filler is in the range of from 0.5 to 50 μm.

* * * * *